(12) United States Patent
Maimon

(10) Patent No.: US 9,647,155 B1
(45) Date of Patent: May 9, 2017

(54) LONG WAVE PHOTO-DETECTION DEVICE FOR USED IN LONG WAVE INFRARED DETECTION, MATERIALS, AND METHOD OF FABRICATION

(71) Applicant: Shimon Maimon, Rochester, NY (US)

(72) Inventor: Shimon Maimon, Rochester, NY (US)

(*) Notice: Subject to any disclaimer, the term of this patent is extended or adjusted under 35 U.S.C. 154(b) by 503 days.

(21) Appl. No.: 14/022,092

(22) Filed: Sep. 9, 2013

Related U.S. Application Data

(60) Provisional application No. 61/698,592, filed on Sep. 8, 2012.

(51) Int. Cl.
| | | |
|---|---|---|
| *H01L 31/102* | (2006.01) | |
| *H01L 31/0352* | (2006.01) | |
| *H01L 31/0304* | (2006.01) | |
| *H01L 31/18* | (2006.01) | |

(52) U.S. Cl.
CPC ........... *H01L 31/035236* (2013.01); *H01L 31/03046* (2013.01); *H01L 31/035281* (2013.01); *H01L 31/1844* (2013.01)

(58) Field of Classification Search
None
See application file for complete search history.

(56) References Cited

U.S. PATENT DOCUMENTS

| | | |
|---|---|---|
| 4,652,335 A | 3/1987 | Decoster et al. |
| 4,679,063 A | 7/1987 | White |
| 4,682,196 A | 7/1987 | Sakai et al. |
| 4,731,640 A | 3/1988 | Bluzer |
| 5,047,622 A | 9/1991 | Chu |
| 6,380,604 B1 | 4/2002 | Shima |
| 6,531,721 B1 | 3/2003 | Burton et al. |

(Continued)

FOREIGN PATENT DOCUMENTS

| | | |
|---|---|---|
| GB | 2127619 | 4/1984 |

OTHER PUBLICATIONS

"nBn detector, an infrared detector with reduced dark current and higher operating temperature", S. Maimon nad G.W. Wicks, Applied Physics Letters 89, 151109 (2006).

*Primary Examiner* — Jerome Jackson, Jr.
*Assistant Examiner* — David Spalla
(74) *Attorney, Agent, or Firm* — Shalom Wertsberger; Saltamar Innovations

(57) ABSTRACT

The disclosure provides a photo-detection device for use in long-wave infrared detection and a method of fabrication. The device comprises a GaSb substrate, a photo absorbing layer comprising InAs/InAsSb superlattice type-II, a barrier layer comprising AlAsSb, and a contact layer comprising InAs/InAsSb superlattice type-II. The barrier layer is configured to allow minority carrier holes current flow while blocking majority carrier electrons current flow between the photo-absorbing and contact layers.

The disclosure further provides a method of producing the photo-detector using photolithography which includes selective etching of the contact layer that stops on the top of the barrier so no etching is made to the barrier layer so the barrier may operate as a passivator too.

The disclosure presents an x-ray and photoluminescence results for InAs/InAsSb superlattice type-II material. Also present a measurement of a single element, Long-Wave photo-detector, showing very low dark current and very high Quantum efficiency, as predicted.

4 Claims, 15 Drawing Sheets

(56) References Cited

U.S. PATENT DOCUMENTS

| | | | |
|---|---|---|---|
| 6,740,908 B1 | 5/2004 | Giboney | |
| 7,180,066 B2 | 2/2007 | Qiu | |
| 7,385,704 B2 | 6/2008 | Mestha et al. | |
| 7,521,737 B2 | 4/2009 | Augusto | |
| 7,531,440 B2 | 5/2009 | Ukai | |
| 7,687,871 B2 | 3/2010 | Maimon | |
| 7,795,640 B2 * | 9/2010 | Klipstein | H01L 31/101 |
| | | | 257/185 |
| 8,003,434 B2 | 8/2011 | Maimon | |
| 8,674,406 B2 | 3/2014 | Scott | |
| 9,117,726 B2 | 8/2015 | Maimon | |
| 2002/0070389 A1 | 6/2002 | Song | |
| 2006/0267007 A1 | 11/2006 | Salzman et al. | |
| 2010/0155777 A1 | 6/2010 | Hill et al. | |
| 2011/0156097 A1 * | 6/2011 | Maimon | B82Y 20/00 |
| | | | 257/188 |

* cited by examiner

LONG WAVE PHOTO-DETECTION DEVICE FOR USED IN LONG WAVE INFRARED DETECTION, MATERIALS, AND METHOD OF FABRICATION

CROSS-REFERENCE TO RELATED APPLICATIONS

This application claims priority to U.S. Provisional Patent Application Ser. No. 61/698,592, filed Sep. 8, 2012, which is hereby incorporated by reference in its entirety.

STATEMENT REGARDING FEDERALLY SPONSORED RESEARCH OR DEVELOPMENT

This invention was made with Government support under HQ0147-12-C-7859 awarded by the Missile Defense Agency. The Government has certain rights in the invention.

FIELD OF THE INVENTION

The present disclosure relates to a method of fabrication of a long wave photo-detection device for use in long wave infrared detection, the device itself, and materials used in the device.

BACKGROUND OF THE INVENTION

The infrared spectrum has offered possibilities beyond human visual capabilities. Infrared (IR) detectors have found their place in many applications, and have been indispensable tools for looking at objects from a different perspective to investigate less-evident properties. As a result, there has been ongoing research in IR-detector technologies, exploring different approaches with a wide range of material systems. These steady advances in technology constantly require better and more sensitive detectors for demanding applications.

The long wave infrared region, also known as the "thermal imaging" region, is the infrared region in which sensors can obtain a completely passive image of objects, based on thermal emissions only and requiring no illumination such as the sun, moon, or infrared illuminator. The classification range of long wave infrared energy varies, but typically falls between either 8 to 12 micrometers or 7 to 14 micrometers.

Infra-red detectors are used in a wide variety of applications, and in particular in the military field where they are used as thermal detectors in night vision equipment, air borne systems, naval systems and missile systems. Highly accurate thermal detectors have been produced using InSb and HgCdTe p-n junction diodes, however these thermal detectors require cooling to cryogenic temperatures of around 77 K which is costly. The cryogenic temperatures primarily are used to reduce the dark current generated in the p-n junction diode by among other effects Shockley Reed Hall (SRH) generation.

The biggest challenge for IR detectors is realization of a device that can create an adequate signal-to-noise ratio. To achieve this, the detector should efficiently absorb light at a particular wavelength. For best performance, it should have dark noise much lower than the signal noise as well as be coupled with read-out electronics that have similar low-noise properties.

In the last few years, a new detector concept had been invented and developed by Dr. Shimon Maimon [Ref. 1,2] called nBn and has become one of the most important concepts in thermal imaging. Until now, the nBn was limited to Mid Wave IR (3-5 micrometer range) using InAsSb as an absorber and AlAsSb as a barrier, with slight modifications performed on these materials for different applications. However, a good absorber material for a long wave nBn has not been developed. An absorber material for a long wave nBn device must: 1. Absorb light in the long wave range and 2. For using the AlAsSb barrier as passivation (AlAsSb was found to be the best passivation that exists today for any IR-detectors), the holes in the absorber need to be able to transport and cannot be localized as in (InAs/GaSb superlattice type-II (sls-II). Also, the barrier must stop electrons from transport between the absorber and the contact layers while at the same time allow for the transport of holes (minority carriers in the absorber) from the absorber to the contact layer.

Accordingly, a need exists for a simple fabrication process for a long wave IR detection device which will allow for a high yield of product operability. These needs and others are met within the present disclosure, which overcomes the deficiencies of previously developed long wave IR detection devices and materials.

BRIEF SUMMARY OF THE INVENTION

The disclosure at hand provides a long wave photo-detection material and device for use in long wave infrared detection as well as a method of fabrication. The absorber material comprises an epitaxial growth on a GaSb substrate, comprising a InAs/InAsSb or InGaAs/InAsSb superlattice type-II material (will be written as In(Ga)As/InAsSb sls-II). The nBn device comprises an n-absorbing layer (of the absorber material), a barrier layer comprising AlAsSb, a first side of the barrier layer adjacent to the first side of the n-absorbing layer, and a contact layer comprising In(Ga)As/InAsSb sls-II adjacent to the second side of the barrier layer opposing the first side. No passivation is needed, as the barrier layer is used for passivation.

Minority carrier, holes, current flow is facilitated while majority carrier current flow is inhibited between the contact and photo absorbing layers. The In(Ga)As/InAsSb sls-II is GaSb free and exhibits an absorption coefficient four times greater than the absorption coefficient of the standard long wave sls-II based on GaSb/InAs. Molecular beam epitaxy is used to grow the photo absorbing layer, barrier layer, and contact layer.

The disclosure further provides a method of producing the photo-detector comprising providing a GaSb substrate, depositing on the substrate a photo absorbing layer comprising In(Ga)As/InAsSb sls-II, depositing on the deposited photo absorbing layer a barrier layer comprising an undoped semiconductor, depositing on the deposited barrier layer a contact layer comprising In(Ga)As/InAsSb sls-II, and configuring the barrier layer to allow minority carrier current flow while blocking majority carrier current flow between the photo-absorbing and contact layers.

Molecular beam epitaxy is utilized in the steps of depositing the photo absorbing layer, depositing the barrier layer, and depositing the contact layer. Selective contact wet etching is utilized to etch the contact layer while stopping at the barrier layer. No passivation is needed, as the un-etched barrier is used as passivation. No dangling bonds of the absorber layer or the "absorber layer and barrier layer" junction area are exposed to the vacuum level.

Accordingly, it is a principal object of the current disclosure to overcome the disadvantages of previous photodetectors due to the simplicity, high yield, and operability of the process of detecting long wave infrared radiation due to the materials utilized in the photodetector.

These and other aspects of the disclosed subject matter, as well as additional novel features, will be apparent from the description provided herein. The intent of this summary is not to be a comprehensive description of the subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages that are included within this description, be within the scope of any claims filed later.

BRIEF DESCRIPTION OF THE DRAWINGS

The novel features believed characteristic of the disclosed subject matter will be set forth in any claims that are filed later. The patent or application file contains at least one drawing executed in color. Copies of this patent or patent application publication with color drawing(s) will be provided by the Office upon request and payment of the necessary fee. The disclosed subject matter itself, however, as well as a preferred mode of use, further objectives, and advantages thereof, will best be understood by reference to the following detailed description of an illustrative embodiment when read in conjunction with the accompanying drawings, wherein:

DETAILED DESCRIPTION OF ILLUSTRATIVE EMBODIMENTS

Reference now should be made to the drawings, in which the same reference numbers are used throughout the different figures to designate the same components.

It will be understood that, although the terms first, second, third, etc. may be used herein to describe various elements, these elements should not be limited by these terms. These terms are only used to distinguish one element from another element. Thus, a first element discussed below could be termed a second element without departing from the teachings of the present disclosure.

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprises" and/or "comprising" or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The use of any and all examples, or exemplary language (e.g., "such as"), is intended merely to better illustrate the disclosure and does not pose a limitation on the scope of the disclosure unless otherwise claimed. No language in the specification should be construed as indicating any non-claimed element as essential to the practice of the disclosure as used herein.

Figure 1A:
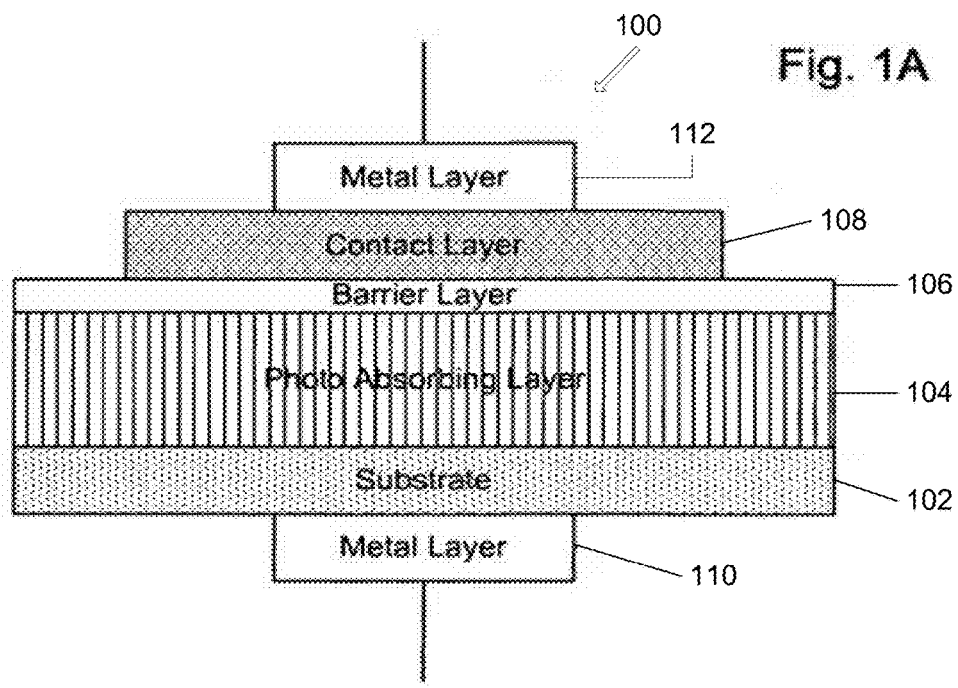
FIG. 1A depicts a schematic view of the layers of an nBn photo-detector according to an embodiment of the present disclosure.

FIG. 1A depicts a schematic view of the layers of a photo-detector 100 according to an embodiment of the present disclosure comprising a substrate 102, a photo absorbing layer 104, a barrier layer 106, a contact layer 108, a metal layer 110 and a metal layer 112. The substrate 102 is provided as a base for deposition of other layers and has deposited on one face a metal layer 110 for connection to electronic circuitry. In an exemplary embodiment metal layer 110 is constituted of gold. The photo absorbing layer 104 is deposited on the second face of the substrate 102 opposing the first face. The photo absorbing layer 104 comprises a semiconductor responsive to photons of the object wavelength, and preferably is deposited to a thickness on the order of an optical absorption length. In one embodiment the photo absorbing layer 104 is deposited to a thickness of between one and two times the optical absorption length. In an exemplary embodiment photo absorbing layer 104 comprises n-doped InAs(3 nm)/InAs$_{0.6}$Sb$_{0.4}$(2 nm) sls-II. In an alternative embodiment the absorbing layer 104 comprises one of n-doped sls-II of InAs(3 nm)/InAs$_{0.75}$Sb$_{0.25}$ (2 nm) or In$_{0.9}$Ga$_{0.1}$As(3 nm)/InAs$_{0.6}$Sb$_{0.4}$(2 nm).

The barrier layer 106 is deposited directly onto the photo absorbing layer 104. The barrier layer 106 is deposited to a thickness sufficient to substantially prevent tunneling of majority carriers between the photo absorbing layer 104 and the contact layer 108. In an exemplary embodiment the barrier layer is deposited to a thickness of 50 nm-100 nm. The barrier layer 106 comprises a material selected to exhibit a high band gap barrier for majority carriers from the photo absorbing layer 104 and substantially no band gap barrier for minority carriers. The barrier layer 106 is thus sufficient to block both the flow of thermalized majority carriers and the tunneling of majority carriers between the photo absorbing layer 104 and the contact layer 108. Thus, for an n-type photo absorbing layer 104, the band gap difference appears in the conduction band, whereas substantially no band gap offset appears in the 270 valence band. In one embodiment, the barrier layer 106 comprises AlAsSb, with arsenic in the range of 10 to 20 percent. In an exemplary embodiment photo absorbing layer 104 comprises InAs/InAs$_{0.6}$Sb$_{0.4}$ sls-II (3 nm/2 nm) and barrier layer 106 is comprised of AlAs$_x$Sb$_{1-x}$, with x~0.1, and thus there is ~0 valence band offset.

The contact layer 108 is deposited on the barrier layer 106. The contact layer 108 functions to absorb the minority carriers diffused from the absorbing layer 104 and is essentially a contact layer. In one embodiment, the barrier layer 106 comprises AlAsSb, with arsenic in the range of 10 to 20 percent. In an exemplary embodiment the contact layer 108 is deposited to a thickness of 100 nm and comprises InAs/InAs$_{0.6}$Sb$_{0.4}$ sls-II (3 nm/2 nm). Advantageously, the contact layer 108 may be constituted of the same material as the photo absorbing layer 104. The contact layer 108 is etched, preferably by photolithography, to define the detector area. Also advantageously, etching of barrier layer 106 or absorbing layer 104 is not required, as no passivation is needed due to the barrier being used for passivation. The metal layer 112 is deposited on the contact layer 108, and in an exemplary embodiment is constituted of gold. The metal layers 110, 112 enable the connection of an appropriate bias, and a connection to detect a flow of current from the photo absorbing layer 104 to the contact layer 108.

Figure 1B:
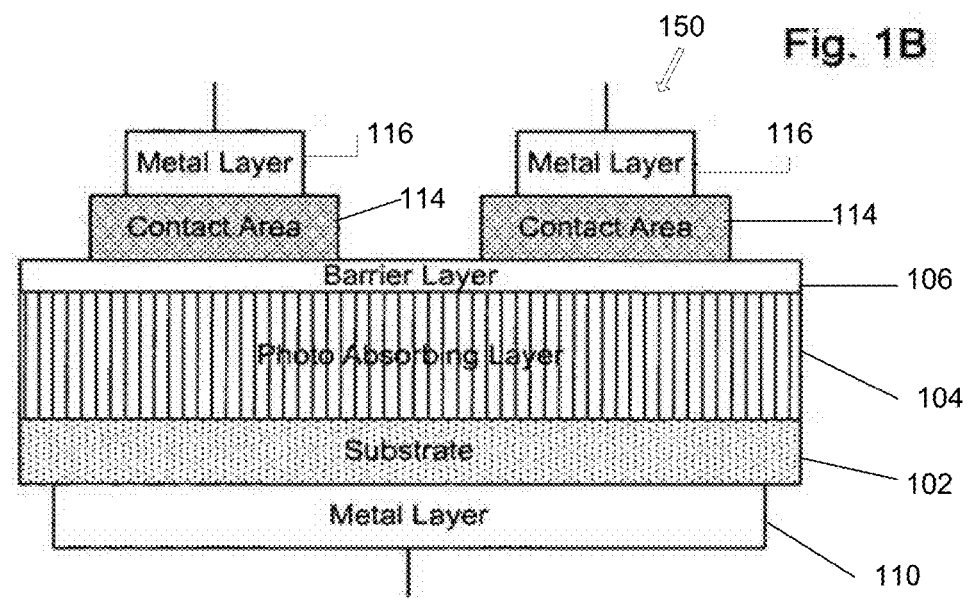
FIG. 1B depicts a side view of a multi-pixel nBn photo-detector 150 according to an embodiment of the current disclosure.

FIG. 1B depicts a side view of a multi-pixel photo-detector 150 according to an embodiment of the current disclosure comprising the substrate 102, the photo absorbing layer 104, the barrier layer 106, a first and second contact area 114, and a first and second metal area 116. The substrate 102 is provided as a base for deposition and has deposited on one face metal layer 110 for connection to electronic circuitry. In an exemplary embodiment the metal layer 110 is constituted of gold. The photo absorbing layer 104 is deposited on the second face of the substrate 102 opposing the first face. The photo absorbing layer 104 comprises a semiconductor responsive to photons of the object wavelength, and preferably is deposited to a thickness on the order of an optical absorption length. In one embodiment the photo absorbing layer 104 is deposited to between one and two times the optical absorption length. In an exemplary embodiment, the photo absorbing layer 104 comprises InAs(3 nm)/InAs$_{0.6}$Sb$_{0.4}$(2 nm) sls-II. In an alternative embodiment, the absorbing layer 104 comprises one of n-doped InAs(3 nm)/InAs$_{0.75}$Sb$_{0.25}$(2 nm) or In$_{0.9}$Ga$_{0.1}$As(3 nm)/InAs$_{0.6}$Sb$_{0.4}$(2 nm).

The barrier layer 106 is deposited directly onto the photo absorbing layer 104. The barrier layer 106 is deposited to a thickness sufficient to substantially prevent tunneling of majority carriers between the photo absorbing layer 104 and the contact layer 108. In an exemplary embodiment, the barrier layer 106 is deposited to a thickness of 50 nm-100 nm. The barrier layer 106 comprises a material selected to exhibit a high band gap barrier for majority carriers from the photo absorbing layer 104 and substantially no band gap barrier for minority carriers. The barrier layer 106 is thus sufficient to block both the flow of thermalized majority carriers and the tunneling of majority carriers between the photo absorbing layer 104 and the contact layer 108. Thus, for an n-type photo absorbing layer 104, the band gap difference appears in the conduction band, whereas substantially no band gap offset appears in the valence band. In one embodiment, the barrier layer 106 comprises AlAsSb, with arsenic in the range of 10 to 20 percent. In an exemplary embodiment, the photo absorbing layer 104 comprises InAs/InAs$_{0.6}$Sb$_{0.4}$ sls-II (3 nm/2 nm) and the barrier layer 106 is comprised of AlAs$_x$Sb$_{1-x}$, with x~0.1, and thus there is ~0 valence band offset.

The contact layer 108 as described above in relation to FIG. 1A is deposited on the barrier layer 106. The contact layer 108, which as will be described further, is etched to define the first and second contact areas 114 and functions to absorb the minority carriers diffused from the absorbing layer 104 and is essentially a contact layer. In an exemplary embodiment the contact layer 108 is deposited to a thickness of 100 nm and is constituted of InAs/InAs$_{0.6}$Sb$_{0.4}$ sls-II (3 nm/2 nm). Advantageously, the contact layer 108 may be constituted of the same material as the photo absorbing layer 104. The contact layer 108 is etched, preferably by photolithography, to define the first and second contact areas 114. Advantageously, etching of the barrier layer 106 or the absorbing layer 104 is not required, and no passivation is needed due to the barrier being used for passivation. In an exemplary embodiment a selective etchant is used which does not etch the barrier layer 106. The metal layer 112 is deposited on each of the first and second contact areas 114, and in an exemplary embodiment is constituted of gold. Thus, a single photo absorbing layer and barrier layer is utilized, with each unetched portion of the contact layer 108 defining a pixel or individual detector.

The above has been described in an embodiment in which two pixels, or detectors are defined, however this is not meant to be limiting in any way. A large array of photo-detectors produced as above is specifically included in the current disclosure.

Figure 2:
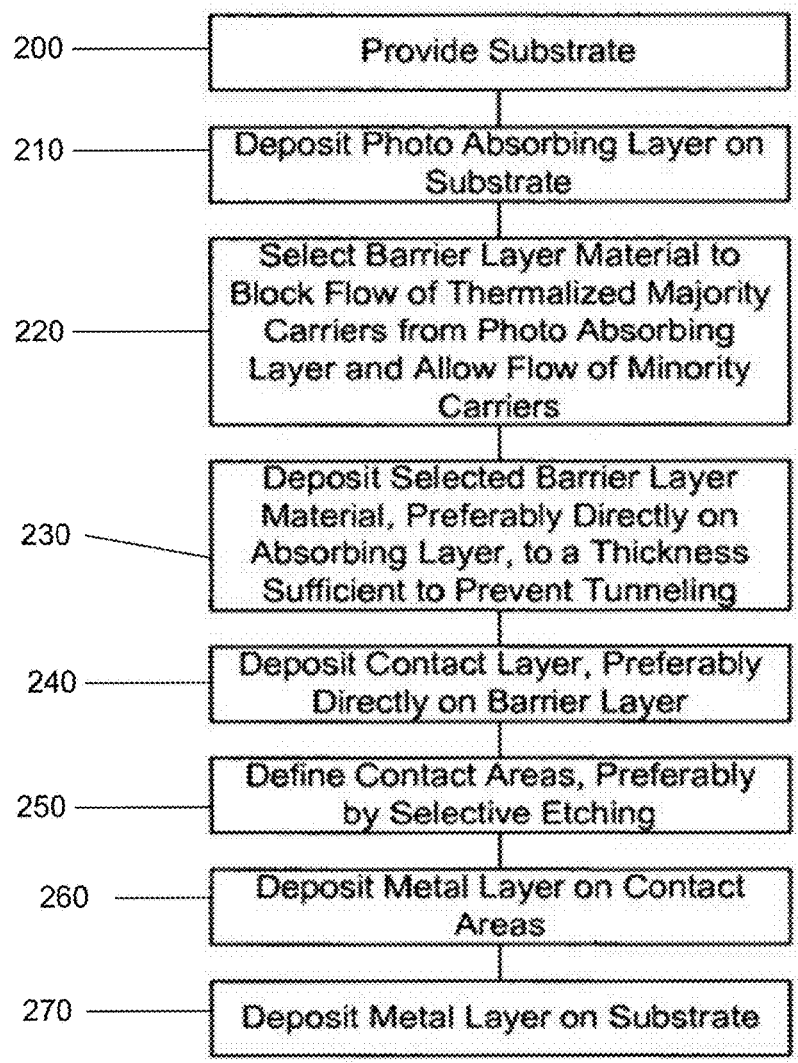
FIG. 2 illustrates a high level flow chart of the process of manufacture of the nBn photo-detector of FIGS. 1A and 1B.

FIG. 2 illustrates a high level flow chart of the process of manufacture of the photo-detector of FIGS. 1A and 1B. In stage 200, a substrate material is provided as a support for deposition. In stage 210, a photo absorbing layer is deposited on the substrate. Preferably the photo absorbing layer is deposited to a thickness on the order of the optical absorption length and in an exemplary embodiment is deposited to a thickness of between one and two times the optical absorption length.

In stage 220, a barrier material is selected such that the flow of thermalized majority carriers from the photo absorbing layer deposited in stage 210 would be negligible, and the flow of minority carriers is not impeded. In stage 230, the barrier material selected in stage 220 is deposited to a thickness sufficient to prevent tunneling of majority carriers through the barrier material. In an exemplary embodiment the thickness is between 50 nm and 100 nm. Preferably the barrier material is deposited directly on the photo absorbing layer deposited in stage 210.

In stage 240, a contact layer is deposited, preferably directly on the barrier material deposited in stage 230. In stage 250, the desired contact areas are defined. Preferably, the contact areas are defined by photolithography and a selective etchant which stops on the top of the barrier layer. Alternatively, the etchant may be controlled to stop once the uncovered portions of contact layer 108 are removed. Thus, the depth of the etch is equivalent to the thickness of the contact layer 108. Advantageously, in an exemplary embodiment that no other layer is etched.

In stage 260 a metal layer is deposited on the contact areas defined in stage 250 so as to enable electrical connection. Preferably the metal layer is deposited directly on the contact areas defined in stage 250. In stage 270, a metal layer is deposited on the substrate 102 provided in stage 200 so as to enable electrical connection.

Deposition of the photo absorbing layer of stage 210, the barrier layer of stage 230 and the contact layer of stage 240 may be accomplished by any means known to those skilled in the art including, without limitation molecular beam epitaxy.

Thus the present embodiment enables a photo-detector sensitive to a target waveband comprising a photo absorbing layer, preferably exhibiting a thickness on the order of the optical absorption length. In an exemplary embodiment the photo absorbing layer is deposited to a thickness of between one and two times the optical absorption length. A contact layer is further provided, and a barrier layer is interposed between the photo absorbing layer and the contact layer. The barrier layer exhibits a thickness sufficient to prevent tunneling of majority carriers from the photo absorbing layer to the contact layer, and a band gap barrier sufficient to block the flow of thermalized majority carriers between the photo absorbing layer and the contact layer. The barrier layer does not block minority carriers.

An infra-red detector in accordance with the principle of the invention can be produced where the barrier layer is designed to have no offset for minority carriers and a band gap barrier for majority carriers. Current in the detector is thus almost exclusively by minority carriers.

Figure 3:
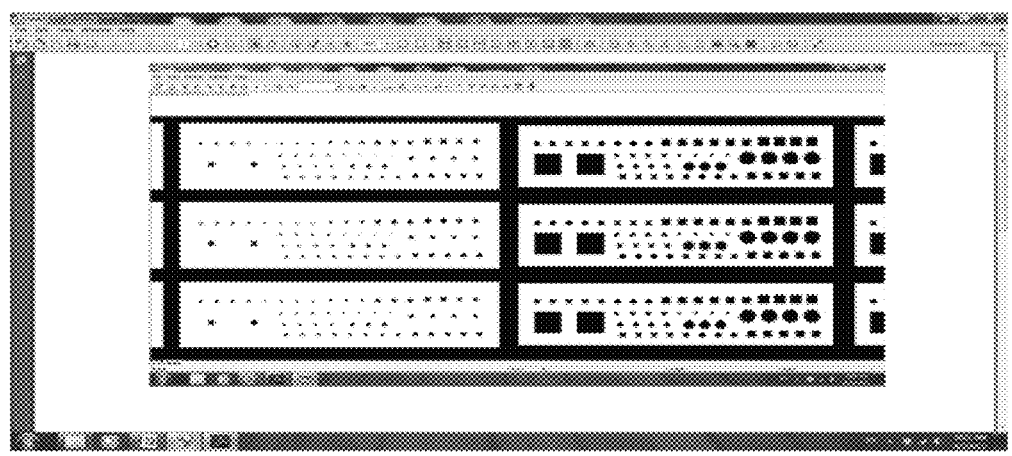
FIG. 3 depicts etching patterns applied to an embodiment of an nBn single element photo detector.

FIG. 3 depicts etching patterns applied to an embodiment of a single element photo detector. In stage 250, the desired contact areas are defined using etching. Preferably, the contact areas are defined by photolithography and a selective etchant which stops on the top of the barrier layer. Alternatively, the etchant may be controlled to stop once the uncovered portions of contact layer 108 are removed. Thus, the depth of the etch is equivalent to the thickness of the contact layer 108. Advantageously, in an exemplary embodiment that no other layer is etched.

Figure 4A:
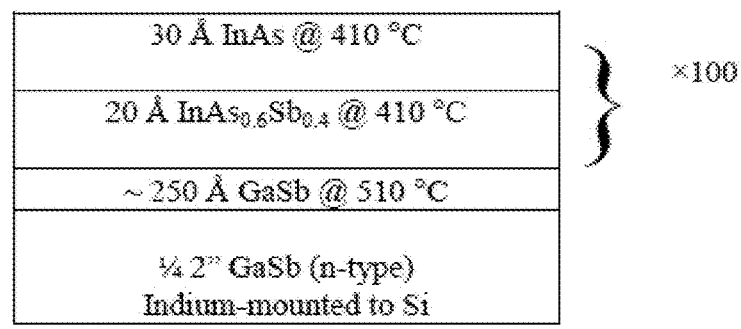
FIG. 4A depicts the specifics of an embodiment of an absorbing layer for a photo detector (SM-6).

FIG. 4A depicts a specification of the growth of the absorbing layer 104 (also referred to as sample SM-6). The bottom two boxes are representative of the substrate 102 and comprise ¼ of 2" of n-type GaSb wafer and 25 nm of GaSb buffer. The GaSb layer was applied at around 510 degrees Celsius to the GaSb bottom layer. The layer representative of the photo absorbing layer 104 comprises a super lattice type-II. The period of the SLS-II comprises two sections. A first section is $InAs_{0.6}Sb_{0.4}$ created at 410 degrees Celsius and is 2 nm thick. The second section is 3 nm and comprises InAs applied at 410 degrees Celsius. The number of periods in this sample is 100.

Figure 4B:
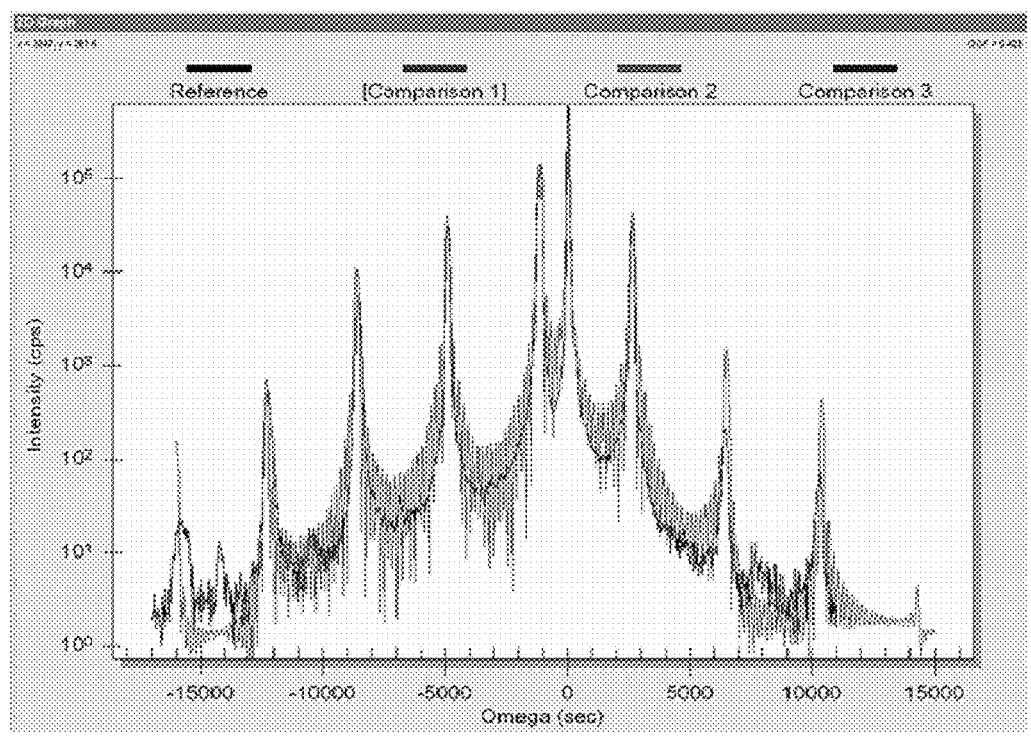
FIG. 4B depicts an X-ray diffraction graph for the embodiment described in FIG. 4A.

FIG. 4B depicts an X-ray diffraction graph for the embodiment described in FIG. 4A. X-ray diffraction serves the purpose of double checking the accuracy of the thicknesses of the layers found in an embodiment and the quality of the material grown. The thickness, according to the graph, of InAs and $InAs_xSb_{1-x}$ are 2.9 nm and 1.95 nm, respectively. The composition of $InAs_xSb_{1-x}$, in terms of x, is $InAs_{0.6}Sb_{0.4}$.

Figure 5A:
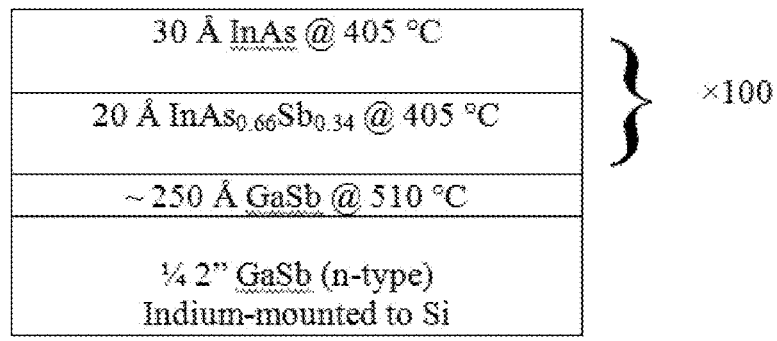
FIG. 5A depicts the specifics of an embodiment of an absorbing layer for a photo detector (SM-4).

FIG. 5A depicts a specification of the growth of the 450 absorbing layer 104 (also referred to as sample SM-4). The bottom two boxes are representative of substrate 102 and comprise ¼ of 2" of n-type GaSb wafer and 25 nm of GaSb buffer. The GaSb layer was applied at around 510 degrees Celsius to the GaSb bottom layer. The layer representative of the photo absorbing layer 104 comprises a super lattice type-II. The period of the SLS-II comprises two sections. A first section is $InAs_{0.66}Sb_{0.34}$ created at 405 degrees Celsius and is 2 nm thick. The second section is 3 nm and comprises InAs applied at 405 degrees Celsius. The number of periods in this sample is 100.

Figure 5B:
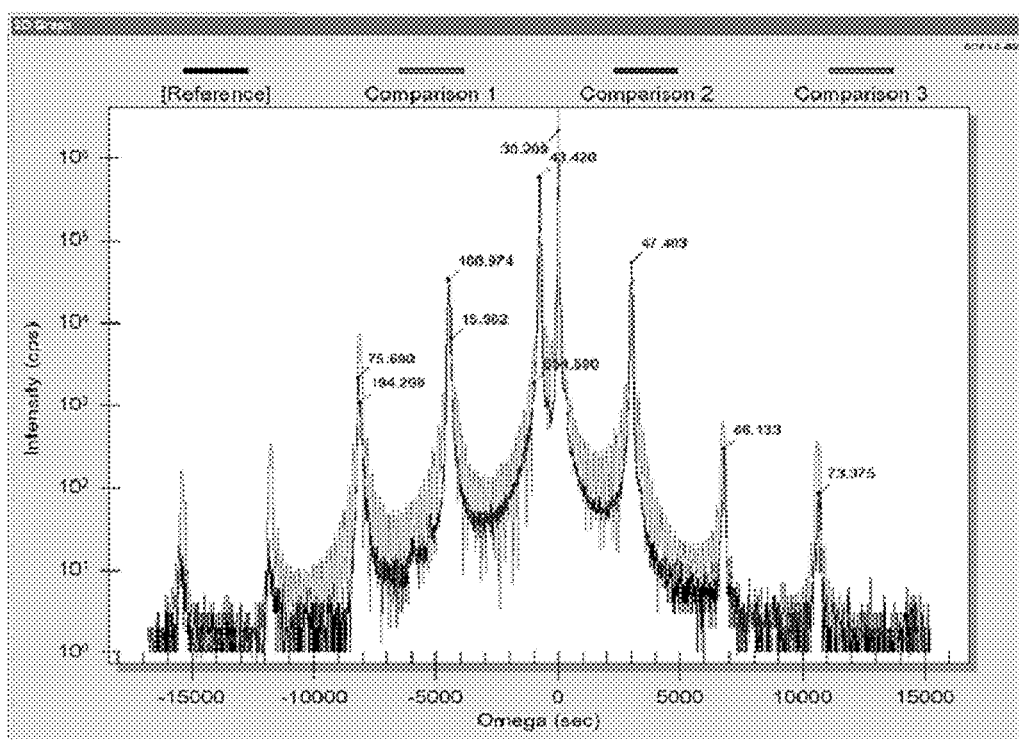
FIG. 5B depicts an X-ray diffraction graph for the embodiment described in FIG. 5A.

FIG. 5B depicts an X-ray diffraction graph for the embodiment described in FIG. 5A. X-ray diffraction serves the purpose of double checking the accuracy of the thicknesses of the layers found in an embodiment and the quality of the material grown. The zero order peak FWHM (full width at half maximum) is 48 arcsec.

Figure 6A:
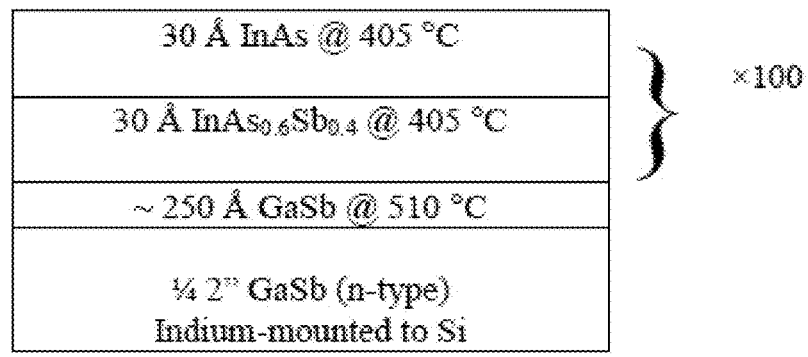
FIG. 6A depicts the specifics of an embodiment of an absorbing layer for a photo detector (SM-5).

FIG. 6A depicts a specification of the growth of the absorbing layer 104 (also referred to as sample SM-5). The bottom two boxes are representative of substrate 102 and comprise ¼ or 2" or n-type GaSb wafer and 25 nm of GaSb buffer. The GaSb layer was applied at around 510 degrees Celsius to the GaSb bottom layer. The layer representative of the photo absorbing layer 104 comprises a super lattice type-II. The period of the SLS-II comprises two sections. A first section is $InAs_{0.6}Sb_{0.4}$ created at 405 degrees Celsius and is 3 nm thick. The second section is 3 nm and comprises InAs applied at 405 degrees Celsius. The number of periods in this sample is 100.

Figure 6B:
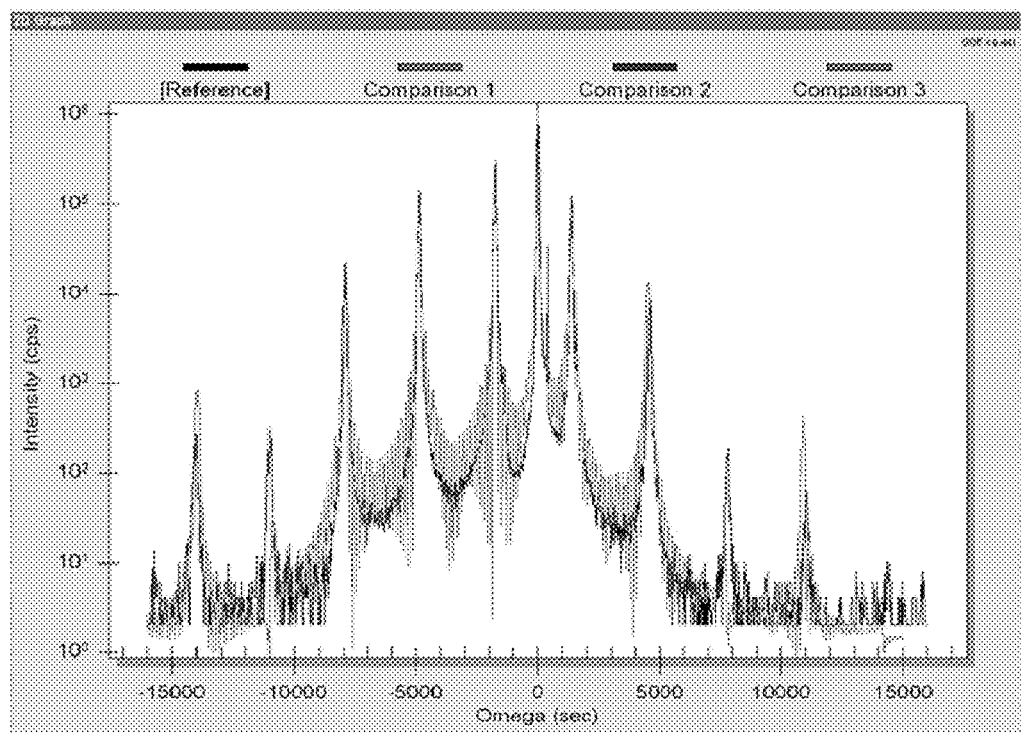
FIG. 6B depicts an X-ray diffraction graph for the embodiment described in FIG. 5A.

FIG. 6B depicts an X-ray diffraction graph for the embodiment described in FIG. 6A. X-ray diffraction serves the purpose of double checking the accuracy of the thicknesses of the layers found in an embodiment and the quality of the material grown. The zero order peak FWHM (full width at half maximum) is 72 arcsec.

Figure 7A:
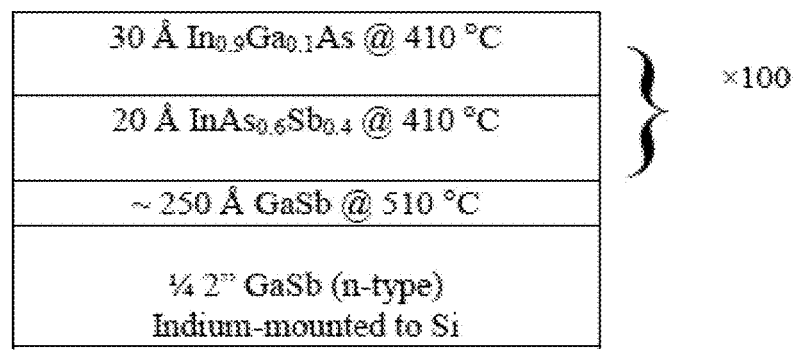
FIG. 7A depicts the specifics of an embodiment of an absorbing layer for a photo detector (SM-14).

FIG. 7A depicts a specification of the growth of the absorbing layer 104 (also referred to as sample SM-14). The bottom two boxes are representative of substrate 102 and comprise ¼ of 2" of n-type GaSb wafer and 25 nm of GaSb buffer. The GaSb layer was applied at around 510 degrees Celsius to the GaSb bottom layer. The layer representative of the photo absorbing layer 104 comprises a super lattice type-II. The period of the SLS-II comprises two sections. A first section is $InAs_{0.6}Sb_{0.4}$ created at 410 degrees Celsius and is 2 nm thick. The second section is 3 nm and comprises $In_{0.9}Ga_{0.1}As$ applied at 405 degrees Celsius. The number of periods in this sample is 100.

Figure 7B:
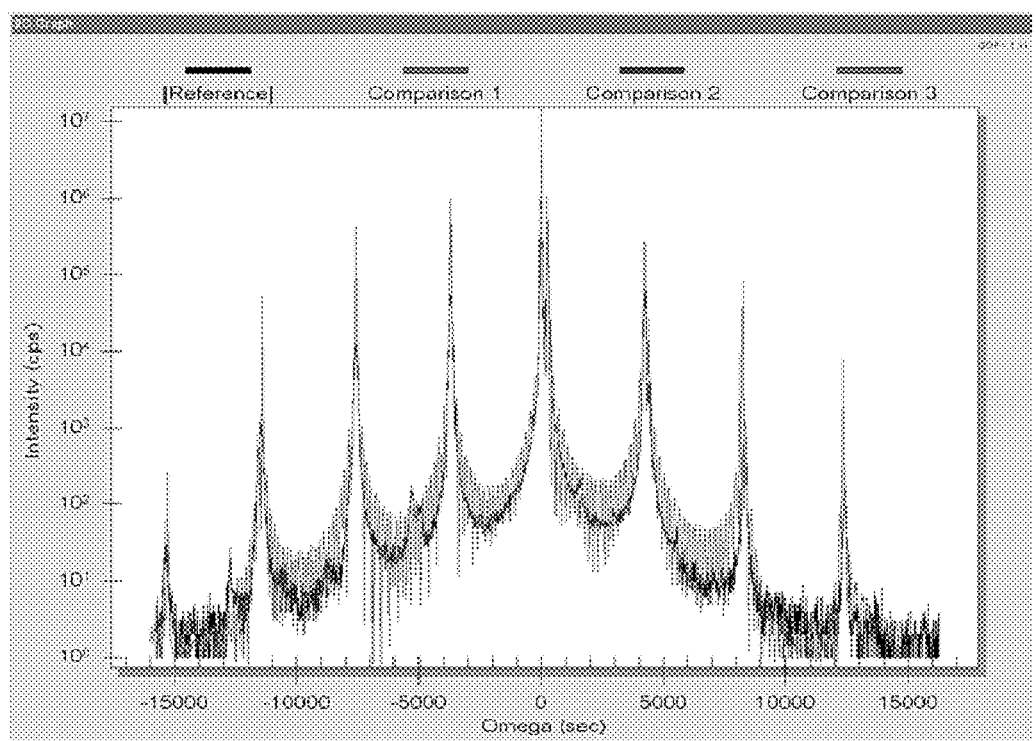
FIG. 7B depicts an X-ray diffraction graph for the embodiment described in FIG. 7A.

FIG. 7B depicts an X-ray diffraction graph for the embodiment described in FIG. 7A. X-ray diffraction serves the purpose of double checking the accuracy of the thicknesses of the layers found in an embodiment and the quality of the material grown. The zero order peak FWHM (full width at half maximum) is 110 arcsec.

The difference between sample SM-14 and SM-6 is the extra Gallium in the InAs layer. This Gallium is only to reduce the compressive strain in SM-6. This difference in the strain can be seen very well in the location of the zero order peak when compared with the substrate peak in the x-ray measurements.

Figures 8A, 8B:
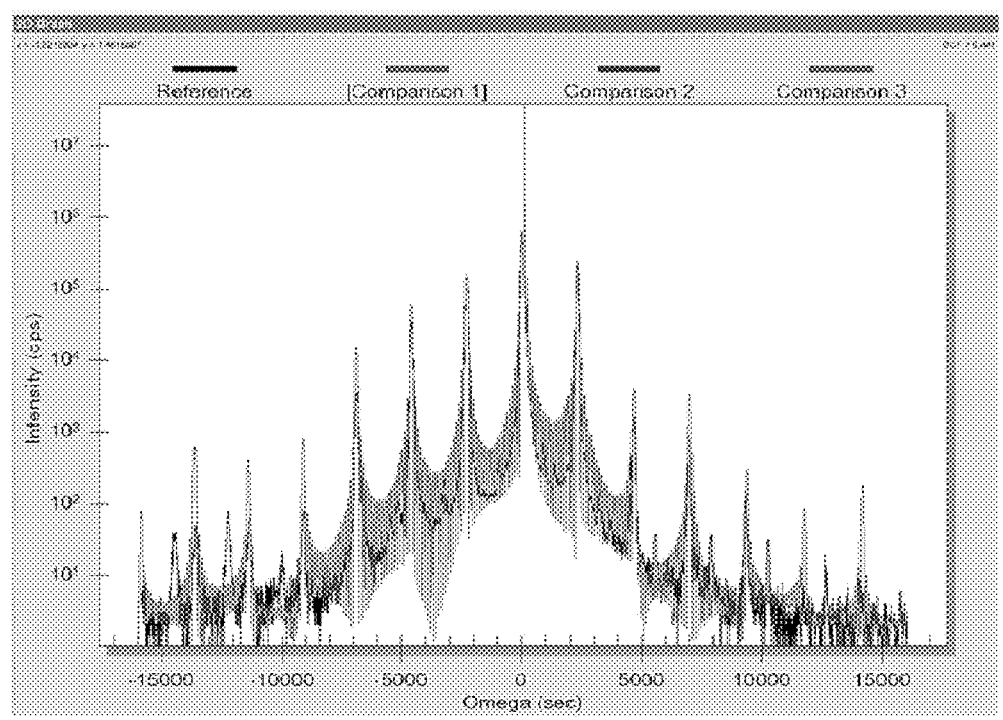
FIG. 8A depicts the specifics of an embodiment of an absorbing layer for a photo detector (SM-15).
FIG. 8B depicts an X-ray diffraction graph for the embodiment described in FIG. 8A.

FIG. 8A depicts the specifics of an embodiment of a photo detector 104 (also referred to as sample SM-15). This embodiment contains a p-n junction and no barrier. The bottom two boxes are representative of substrate 102 and comprise ¼ of 2" of p-type GaSb wafer and 25 nm of GaSb buffer. The GaSb layer was applied at around 510 degrees Celsius to the GaSb bottom layer. The layer representative of the photo absorbing layer 104 is comprised of a super lattice type-II. The period of the SLS-II comprises two sections. A first section is p-InAs$_{0.7}$Sb$_{0.3}$ created at 410 degrees Celsius and is 3 nm thick. The second section is 6 nm thick and comprises p-InAs applied at 410 degrees Celsius. The number of periods is 150. The layer representative of the contact layer 108 also comprises superlattice type-II. The period of the SLS-II comprises two sections. A first is n-InAs$_{0.7}$Sb$_{0.3}$ created at 410 degrees Celsius and is 3 nm thick. The second section is 6 nm and comprises n-InAs applied at 410 degrees Celsius. The number of periods in the contact layer is 50.

FIG. 8B depicts an X-ray diffraction graph for the embodiment described in FIG. 8A. X-ray diffraction serves the 525 purpose of double checking the accuracy of the thicknesses of the layers found in an embodiment and the quality of the material grown. The zero order peak FWHM (full width at half maximum) is 100 arcsec.

Figure 9:
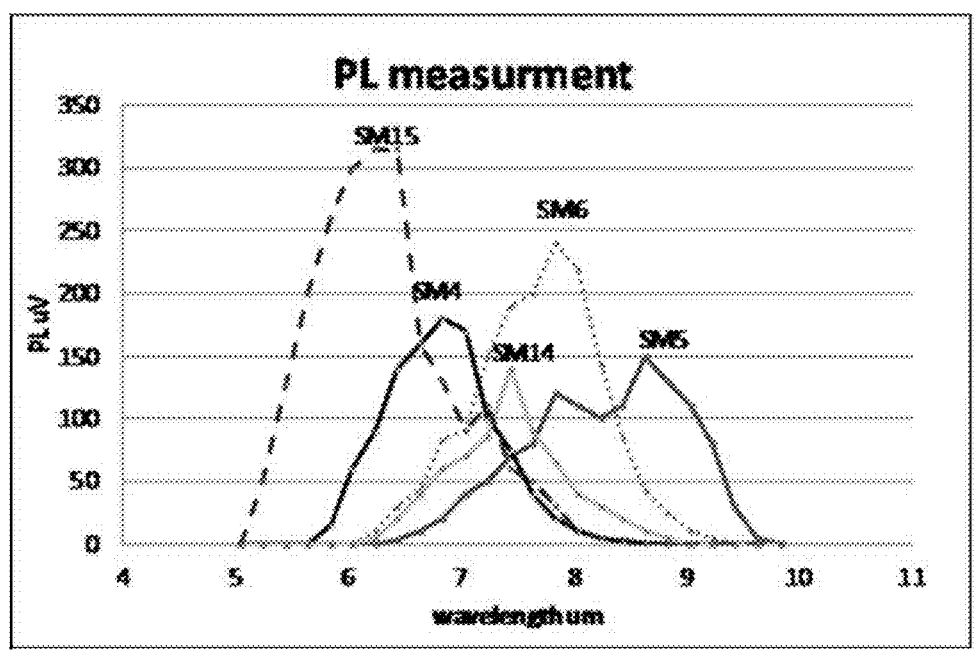
FIG. 9 depicts a photoluminescence measurement made on embodiments shown in FIG. 4A, FIG. 5A, FIG. 6A, FIG. 7A and FIG. 8A at 77K.

FIG. 9 depicts a photoluminescence measurement made on samples SM-4, SM-5, SM-6, SM-14 and SM-15 at 77K. This measurement shows that the material base on InAs/InAs$_{0.6}$Sb$_{0.4}$ and In$_{0.9}$Ga$_{0.1}$As/InAs$_{0.6}$Sb$_{0.4}$ are very good materials for long wave application and long wave detectors.

Figure 10A:
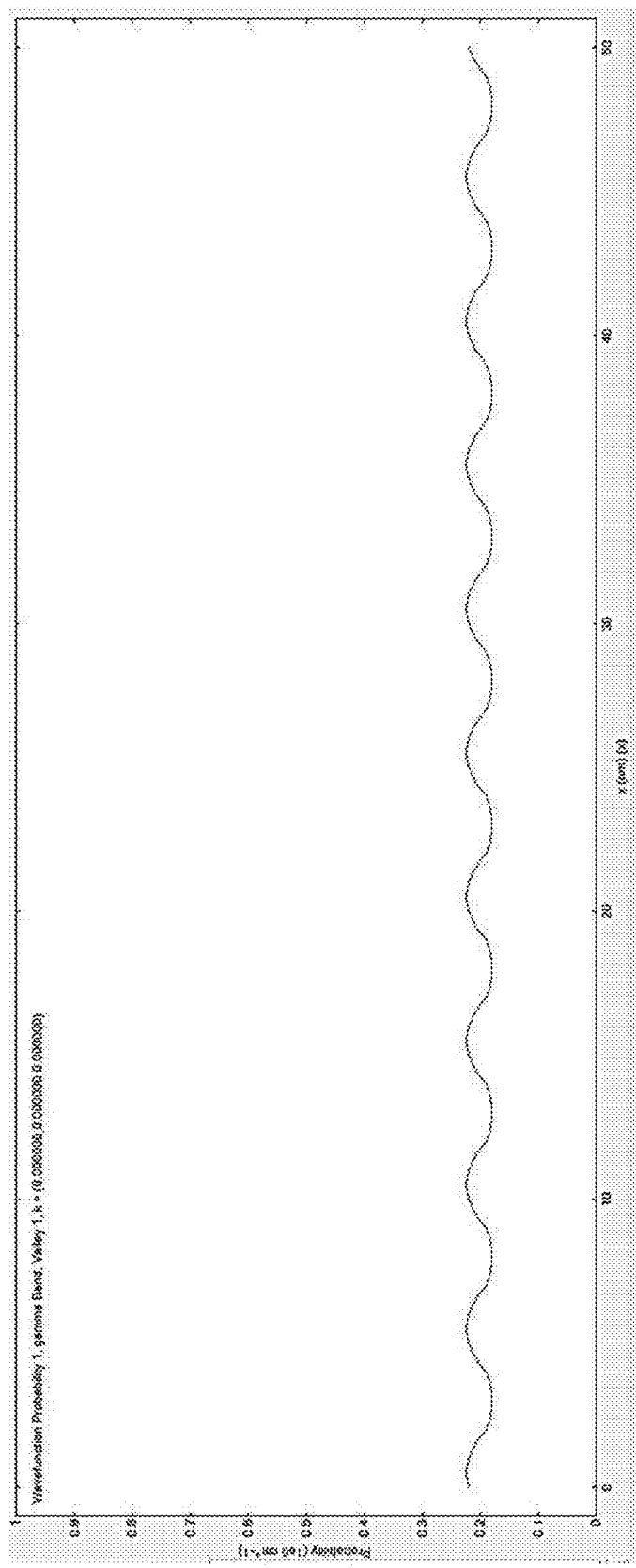
FIG. 10A depicts a simulated electron wave function of InAs/InAsSb sls-II.
Figure 10B:
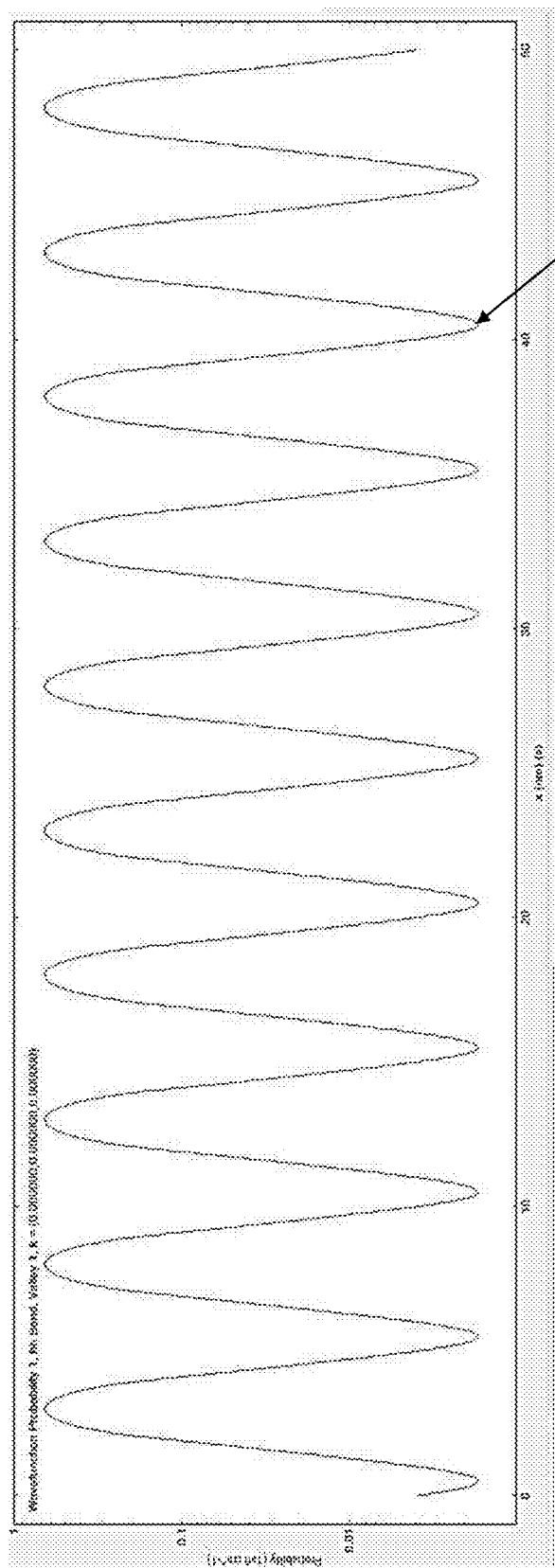
FIG. 10B depicts a simulated hole wave function of InAs/InAsSb sls-II.

FIGS. 10A and 10B depict a simulated electron and hole wave function of InAs(3 nm)/InAs$_{0.6}$Sb$_{0.4}$(2 nm) sls-II. For explaining the photoluminescence result, NEXTNANO simulation is utilized. In this program, the parameters of the "bowing for the valance band offset" are adjusted for the InAsSb material system. The past number that has been used in the academic literature is "minus 0.47 eV". To fit the photoluminescence results of the current disclosure, this number needs to be "minus 1 eV". Surprisingly, this is the same number that had been used for the GaAsSb system. After adjusting this parameter, all of the photoluminescence results were fitting very well. In addition, the prediction of the results of more InAs/InAsSb SLS-II has been successful. Further measurements have confirmed the correctness of these predictions. However, one important prediction is important for the Mid Wave regime and it is that InAs(3 nm)/InAs$_{0.75}$Sb$_{0.25}$(2 nm) sls-II which is a strain free sls-II (when grown on GaSb) that can operate in the 5 micrometer cut-off Mid Wave with a very good hole transport and it is a fitting material for the 5 micrometer cutoff nBn.

FIG. 10A depicts a simulated electron wave function of InAs(3 nm)/InAs$_{0.6}$Sb$_{0.4}$(2 nm) sls-II. The electrons are not localized at all.

FIG. 10B depicts a simulated hole wave function of InAs(3 nm)/InAs$_{0.6}$Sb$_{0.4}$(2 nm) sls-II. The holes are localized in their quantum wells but this localization is two orders of magnitude smaller when compared with the InAs/GaSb sls-II for long wavelength. It is expected that hole transport in InAs(3 nm)/InAs$_{0.6}$Sb$_{0.4}$(2 nm) sls-II will be much better compared with the standard InAs/GaSb sls-II and results with the ability to make nBn long wave devices.

Figure 10C:
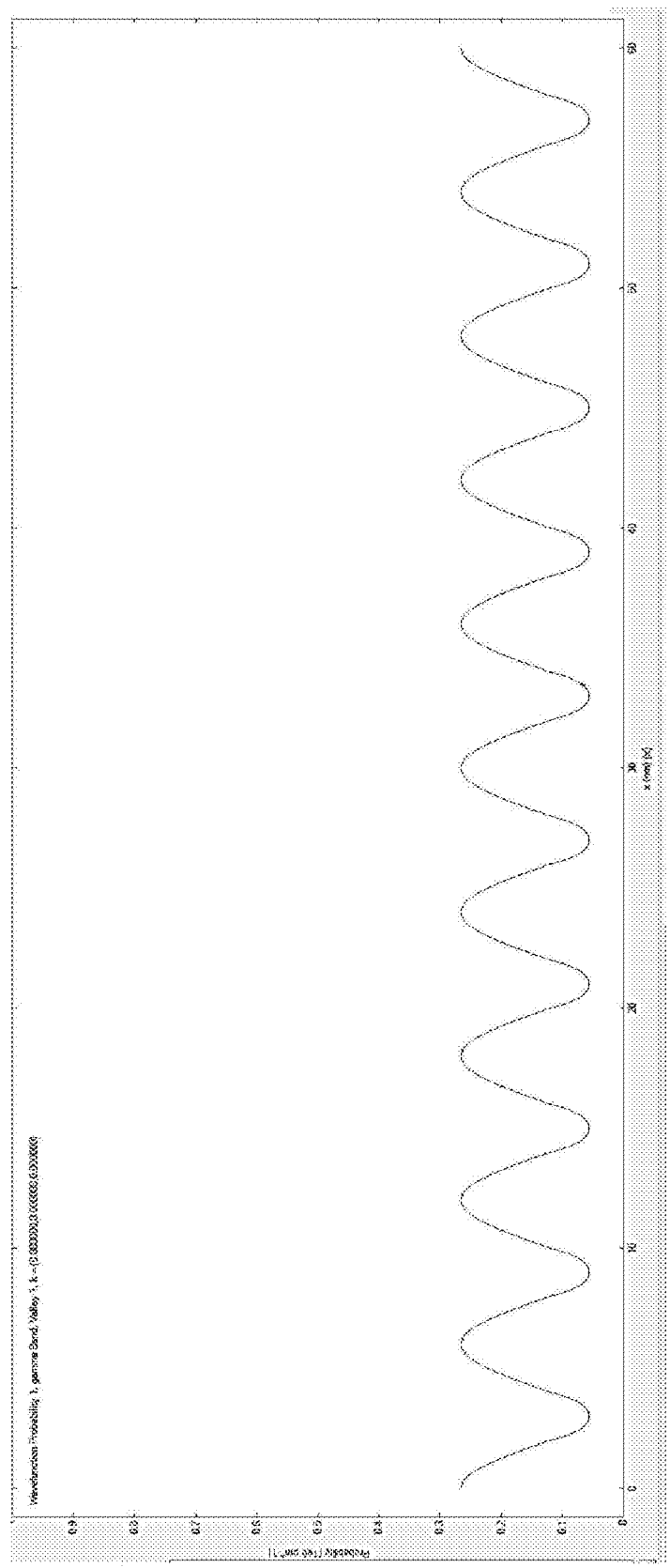
FIG. 10C depicts a simulated electron wave function of InAs/GaSb sls-II.

FIG. 10C depicts a simulated electron wave function of InAs/GaSb sls-II.

Figure 10D:
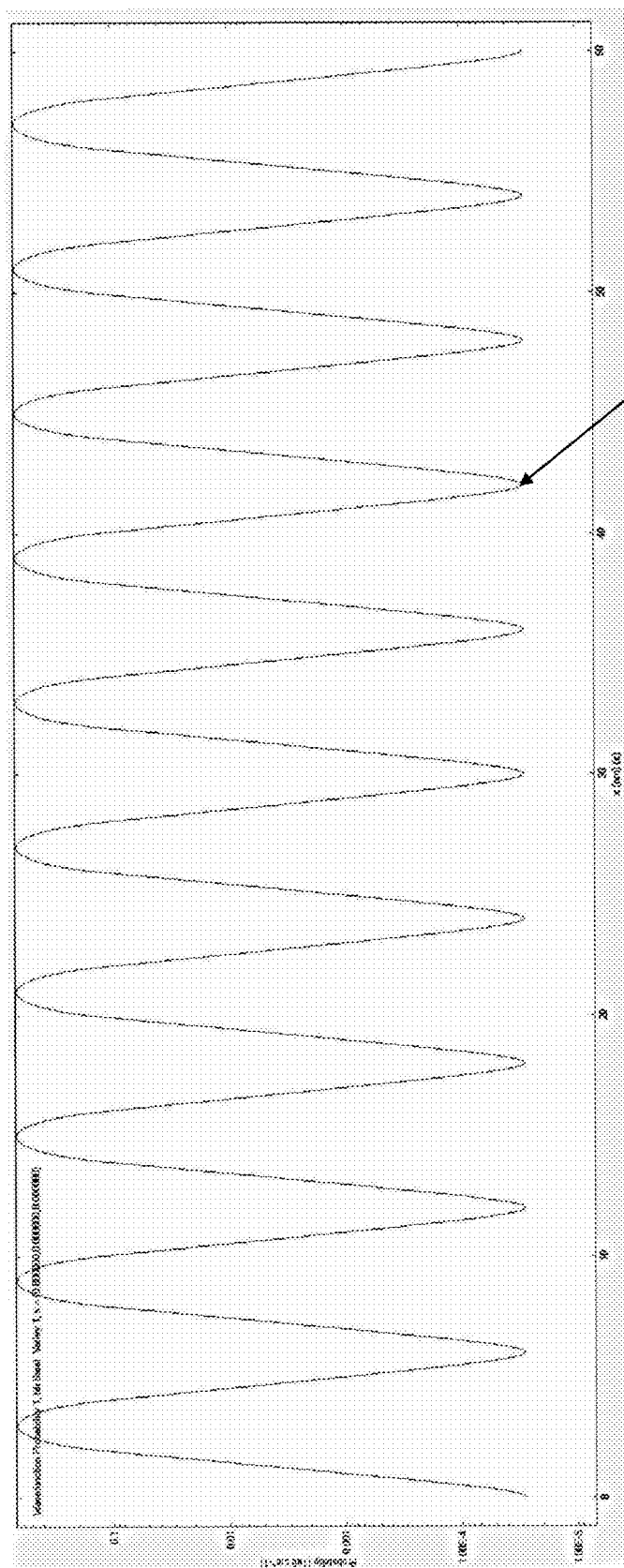
FIG. 10D depicts a simulated hole wave function of InAs/GaSb sls-II.

FIG. 10D depicts a simulated hole wave function of InAs/GaSb sls-II. The holes are very localized in their quantum wells. No transport of holes is expected. This is the reason why no nBn devices are made based on InAs/GaSb sls-II.

Using the calculation of the wave functions, the overlapping factor, $<\psi_{hh}||\psi_e>$, was calculated for the different material systems (InAs/InAsSb sls-II and InAs/GaSb sls-II). The overlapping factor is two times higher in the InAs/InAsSb sls-II system. This results in a four time higher absorption coefficient for InAs/InAsSb when compared to the GaSb/InAs SLS-II and much better quantum efficiency in detector performance.

Figures 11A, 11B:
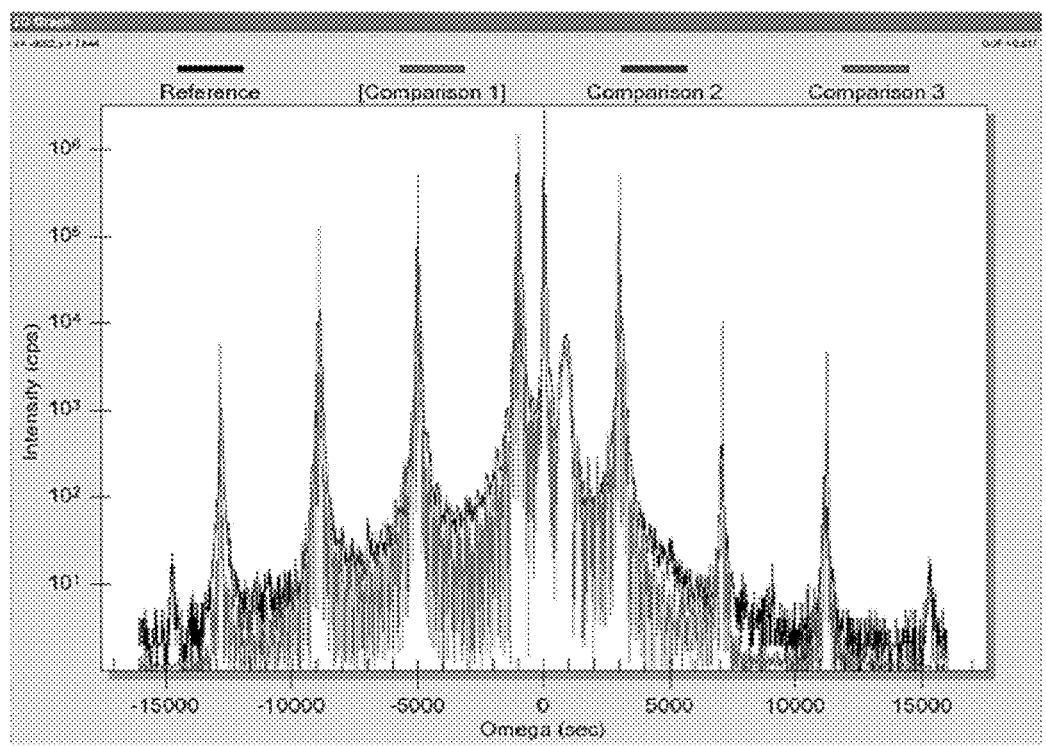
FIG. 11A depicts the specifics of an embodiment of an nBn photo detector (SM-11).
FIG. 11B depicts an X-ray diffraction graph for the embodiment described in FIG. 11A.

FIG. 11A depicts the specifics of an embodiment of a photo detector 100 (also referred to as sample SM-11). This embodiment contains an nBn structure based on the SM-6 absorber. The bottom two boxes are representative of substrate 102 and comprise ¼ of 2" or n-type GaSb wafer and 25 nm of GaSb buffer. The GaSb layer was applied at around 510 degrees Celsius to the GaSb bottom layer. The layer representative of the photo absorbing layer 104 comprises an n-type super lattice type-II. The period of the SLS-II comprises two sections. A first section is InAs$_{0.6}$Sb$_{0.4}$ created at 410 degrees Celsius and is 2 nm thick. The second section is 3 nm and comprises InAs applied at 410 degrees Celsius. The number of periods in this sample is 200, with a total of 1000 nm of absorbing layer. The layer representative of the barrier located above SLS-II representing the photo absorbing layer is un-doped AlAs$_{0.1}$Sb$_{0.9}$, created between 420 to 450 degrees Celsius and is 50 nm thick. The layer representative of the contact layer 108 comprises an n-type super lattice type-II. The period of the SLS-II comprises two sections. A first section is InAs$_{0.6}$Sb$_{0.4}$ created at 410 degrees Celsius and is 2 nm thick. The second section is 3 nm and comprises InAs applied at 410 degrees Celsius. The number of periods in this sample is 20, with a total of 100 nm thick contact layer.

FIG. 11B depicts an X-ray diffraction graph for the embodiment described in FIG. 11A. X-ray diffraction serves the purpose of double checking the accuracy of the thicknesses of the layers found in an embodiment and the quality of the material grown. The thickness, according to the graph, of InAs and InAs$_x$Sb$_{1-x}$ are 2.75 nm and 1.83 nm, respectively. The composition of InAs$_x$Sb$_{1-x}$, in terms of x, is InAs$_{0.62}$Sb$_{0.38}$ and the composition of the barrier AlAs$_y$Sb$_{1-y}$, in terms of y, is AlAs$_{0.13}$Sb$_{0.87}$. The zero order peak FWHM (full width at half maximum) is 85 arcsec.

Figure 12:
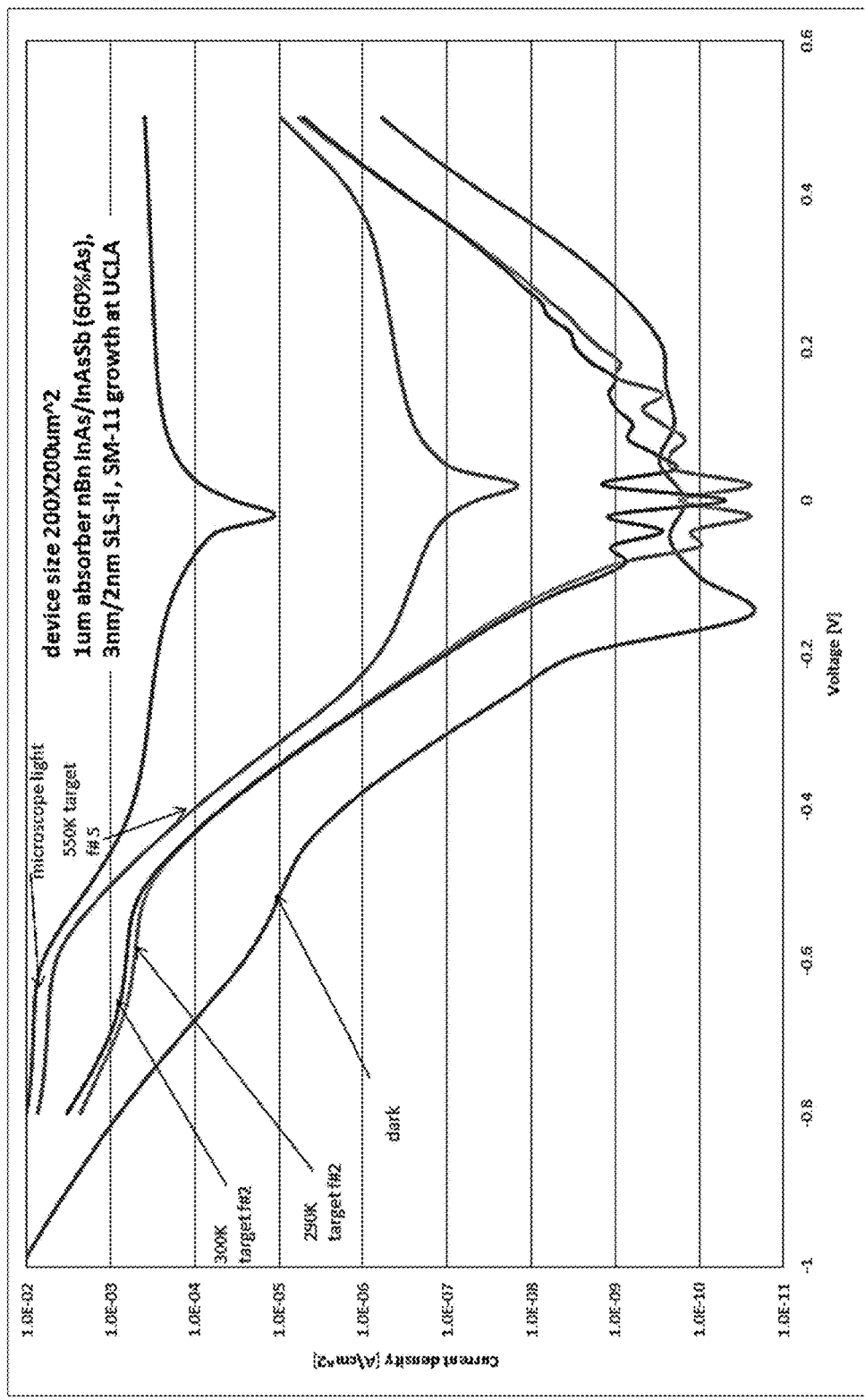
FIG. 12 depicts an I-V measurement of the embodiment described in FIG. 11A.

FIG. 12 depicts an I-V measurement of the embodiment described in FIG. 11A (sample SM-11) at 77K. This single element photodetector embodiment has a very low dark current density ($8\times10^{-6}$ A/cm$^2$) and around 25 percent quantum efficiency. In this device, holes make the transport between the photo absorbing layer 104 and the contact layer 108. According to knowledge, this is the smallest dark current measure in the long wave devices and is the highest quantum efficiency measure for top illumination 1 micrometer absorber in the long-wave. The device made using the process describe in FIG. 2 and using the photolithography mask in FIG. 3. The low ratio between the response to the 300K target and the 550K target (in the Mid wave regime this ratio will be in range of hundreds, while here it is ~5 as expected from a long wave device) helps to back up the fact that the embodiments in this current disclosure are long wave devices. In addition, the high quantum efficiency is proof of the high absorption coefficient of this material as predicted by simulation.

Advantageously the photo-detector of the current disclosure does not exhibit a depletion layer, therefore significantly reducing dark current. Furthermore, in an exemplary embodiment passivation is not required as the barrier layer further functions to achieve passivation.

While this disclosure has been particularly shown and described with reference to preferred embodiments thereof and to the accompanying drawings, it will be understood by those skilled in the art that various changes in form and details may be made therein without departing from the spirit of this disclosure. Therefore, the scope of the disclosure is defined not by the detailed description but by the appended claims.

What is claimed is:

1. A photo-detector that detects long wave infrared radiation, comprising:
    a substrate;
    an n-type photo absorbing layer comprising a superlattice type II of periods of InAs(3 nm)/InAs$_{0.6}$Sb$_{0.4}$(2 nm) that exhibits a valence band energy and conducting band energy during operation of the photo-detector deposited on said substrate;
    a barrier layer comprising an undoped AlAs$_{0.13}$Sb$_{0.87}$ semiconductor having a band energy gap and associated conduction and valence band energies;
    a first side of said barrier layer adjacent a first side of said photo absorbing layer;
    a contact layer comprising an n-type superlattice type II of periods of InAs(3 nm)/InAs$_{0.6}$Sb$_{0.4}$(2 nm) exhibiting a valence band energy and a conducting band energy during operation of the photo-detector and being adjacent a second side of said barrier layer opposing said first side;
    wherein the relationship between the photo absorbing layer and contact layer valence and conduction band energies and the barrier layer conduction and valance band energies facilitates minority carrier holes current flow while inhibiting majority carrier electrons current flow between the contact and photo absorbing layers.

2. A photo-detector according to claim 1, wherein the photo-detector absorbs infrared radiation greater than or equal to 8 microns.

3. A photo-detector according to claim 1, wherein said photo absorbing layer, said barrier layer, and said contact layer are created via molecular beam epitaxy.

4. A photo-detector according to claim 1, wherein the barrier is used for passivation.

\* \* \* \* \*